United States Patent [19]

West

[11] Patent Number: 5,285,015
[45] Date of Patent: Feb. 8, 1994

[54] PATTERNED CIRCUITRY WITH FORAMINOUS SUBSTRATE AND METHOD OF MAKING

[76] Inventor: Frederick A. West, 507 Forrest Ct., Crestview, Fla. 32536

[21] Appl. No.: 33,722

[22] Filed: Mar. 18, 1993

Related U.S. Application Data

[63] Continuation-in-part of Ser. No. 475,578, Feb. 6, 1990, Pat. No. 5,201,974.

[51] Int. Cl.⁵ .............................................. H01B 13/00
[52] U.S. Cl. ..................................... 174/255; 156/47; 156/243; 264/104; 427/96; 428/901
[58] Field of Search .................. 439/91; 174/255, 264, 174/250; 427/96; 264/104; 156/47, 243; 428/901; 118/211, 216, 219

[56] References Cited

U.S. PATENT DOCUMENTS

| | | | |
|---|---|---|---|
| 3,350,498 | 10/1967 | Leeds | 174/264 |
| 3,704,164 | 11/1972 | Travis | 428/901 X |
| 4,067,945 | 1/1978 | DuRocher | 264/104 |
| 4,103,102 | 7/1978 | Klein | 174/255 X |
| 4,604,160 | 8/1986 | Murakami et al. | 174/255 X |
| 4,651,417 | 3/1987 | Schumacher, III et al. | 174/255 X |
| 4,673,904 | 6/1987 | Landis | 174/261 X |
| 4,769,270 | 9/1988 | Nagamatsu et al. | 174/255 X |
| 4,875,282 | 10/1989 | Leibowitz | 174/255 X |
| 4,912,020 | 3/1990 | King et al. | 427/96 X |

*Primary Examiner*—Michael W. Ball
*Assistant Examiner*—Michele K. Yoder
*Attorney, Agent, or Firm*—Charles A. McClure

[57] ABSTRACT

Patterned electrical circuitry in laminar form with foraminous substrate having been sized with conductive and non-conductive compositions in any desired side-by-side patterned configuration. The resulting lamina is substantially homogeneous electrically through any part of its thickness despite the interposition of fragmentary portions of the foraminous substrate, which may be made up of paper, polymeric film, or textile material.

20 Claims, 4 Drawing Sheets

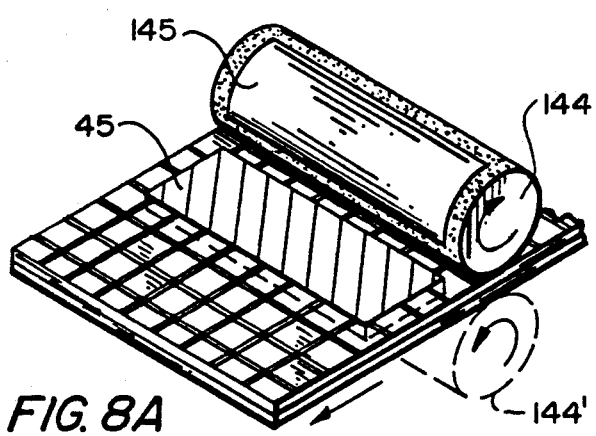
FIG. 8A
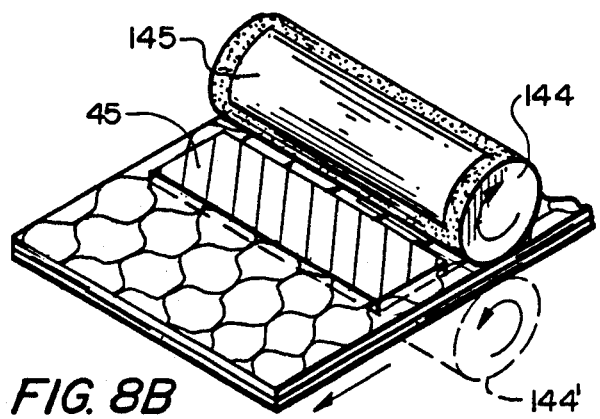
FIG. 8B
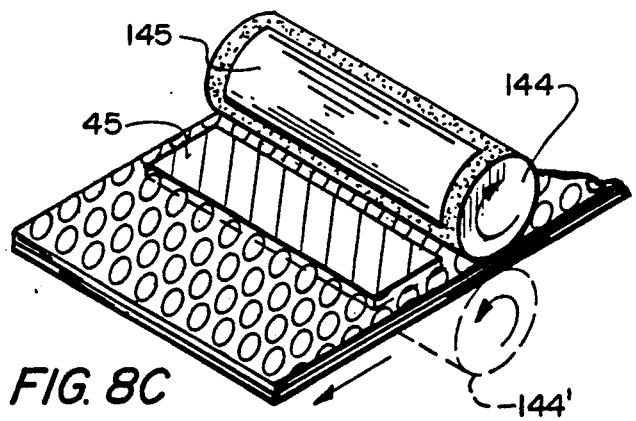
FIG. 8C
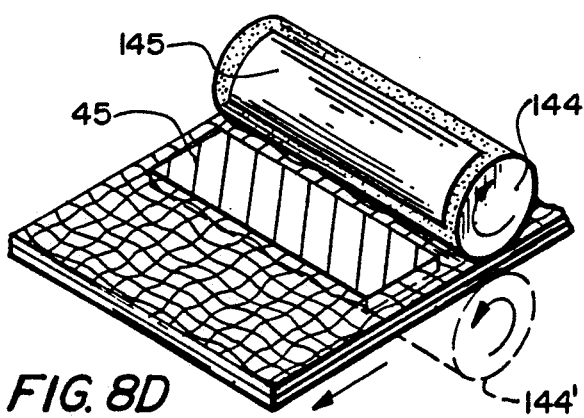
FIG. 8D
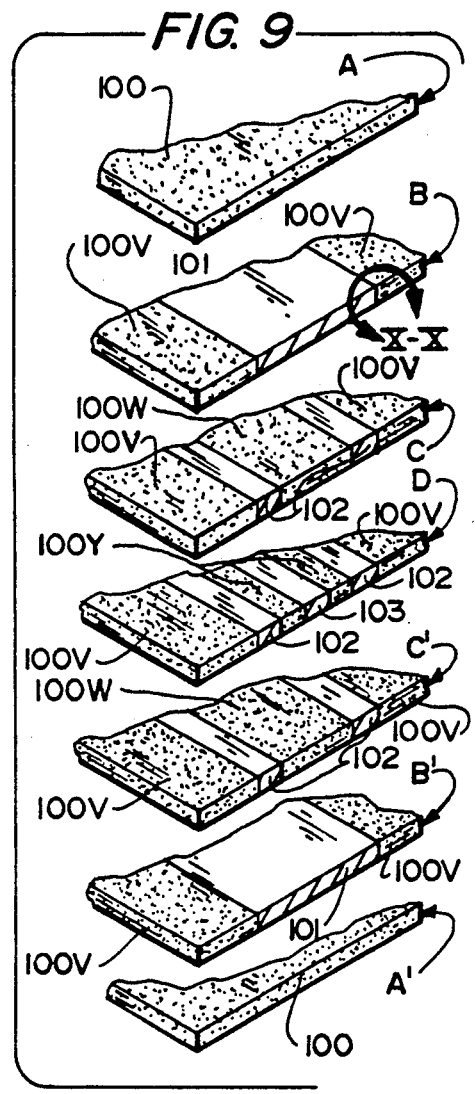
FIG. 9
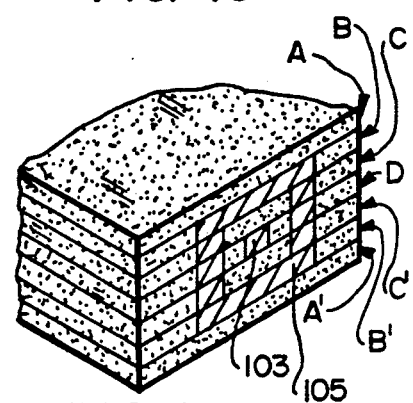
FIG. 10
FIG. 11

PATTERNED CIRCUITRY WITH FORAMINOUS SUBSTRATE AND METHOD OF MAKING

This is a continuation-in-part of my patent application, Ser. No. 475,578 filed 6 Feb. 1990, now U.S. Pat. No. 5,201,974.

TECHNICAL FIELD

This invention relates to double-faced electronic circuitry having foraminous substrate material impregnated with conductive and non-conductive compositions in side-by-side patterned configuration.

BACKGROUND OF THE INVENTION

Circuit boards or "cards" are an accepted means for installing auxiliary or supplemental interchangeable circuitry in computers and electronic equipment of all kinds—found in automobiles, appliances, etc. The boards themselves are undergoing continual changes, such as conversion to surface mounting of components, but in general have become so well accepted as to escape some desirable critical review.

Usual substrate material for circuit boards or the like is non-conductive and in the form of self-supporting sheets to carry conductive structures plated or otherwise deposited thereon, as in a thin film, or inserted into bores or openings molded or otherwise formed therein, or secured thereto in some acceptable manner. Conductive structures on one or both faces thereof may be connected to one another by conductive traces along a face or via bores from one face through to the opposite face plus appropriate terminals, leads, etc. Resulting circuit boards and their component substrates usually are made up of smooth-surfaced polymeric thermoplastic sheet material with a thickness on the order of a millimeter or so, with or without a fibrous filler reinforcement, and capable of being flexed a bit.

Even "substrate-less" circuit boards disclosed in the present inventor's aforementioned patent, require physical support during their formative stages—removable at a later stage in the process. It would be advantageous if temporary support could be incorporated into the resultant structure while retaining benefits of substantial face-to-face homogeneity of side-by-side non-conductive and conductive compositions in a patterned electrical structural lamina.

SUMMARY OF THE INVENTION

A primary object of the present invention is to use foraminous laminar material as a temporarily supporting substrate for forming laminae of patterned electrical structures.

Another object of this invention is to embody such temporarily supporting substrate in resulting self-supporting laminae patterned from face-to-face with side-by-side electrical circuitry.

A further object of the invention is to retain the face-to-face patterning in laminates of such self-supporting patterned laminae.

Yet another object is to provide three-dimensional circuitry by face-to-face lamination of a plurality of the resulting laminae.

A still further object is to accomplish the foregoing objects economically, effectively, and expeditiously.

In general, the objects of this invention are accomplished by providing a strip of paper, textile, or other polymeric material, rendering the strip foraminous (if not already so) and/or stiffening the strip to be self-supporting (if not already so), sizing one or both faces of the strip with curable finely divided non-conductive and conductive material in side-by-side patterned configuration, so impregnating the strip and filling its foraminous openings therewith, and curing the sizing material into self-supporting condition.

For example, a polymeric film no more than partially set can be embossed and the thin portions be removed to leave openings, or if already set can be slit and be expanded to provide openings; set film or dry paper if stiff can be slit and be expanded to provide openings, or if limp can be stiffened and then perforated; a textile material if stiff can be perforated, or if limp can be stiffened and if not open-mesh can be perforated (if needed), or if open-mesh can either be used as is or be supplementarily perforated. Resulting foraminous strips are sized with curable non-conductive and conductive paste contiguously side-by-side, preferably on both faces, and the paste is then cured in place on the substrate, providing a lamina patterned alike from face to face, substantially homogeneous electrically through any part of its thickness despite interposition of discontinuous portions of paper, textile fiber, or plastic film.

Preferred methods of applying stiffening agent include misting and passage over a lick roll. Preferred methods of rendering a film foraminous include punch perforation, slit expansion, and embossing.

Other objects of the present invention, together with means and methods for attaining the various objects, will be apparent from the following description and accompanying diagrams of preferred embodiments, which are presented by way of example rather than limitation.

SUMMARY OF THE DRAWINGS

FIGS. 8A to 8D are similarly corresponding representations of subsequent roll application of sizing composition to the respective materials in the preceding corresponding set of views 7A to 7D;

FIG. 9 is an exploded perspective view of a series of laminae of resulting side-by-side electrically conductive and non-conductive portions, in both like and unlike patterns suited to being laminated into a three-dimensional circuit according to this invention;

FIG. 10 is an enlarged end detail at X—X on lamina B of FIG. 9, showing side-by-side conductive and non-conductive portions with discontinuous foraminous substrate embedded in both alike; and FIG. 11 is a perspective end view of a coaxial waveguide as a three-dimensional laminate made of the component laminae of FIG. 9.

DESCRIPTION OF THE INVENTION

Figure 1:
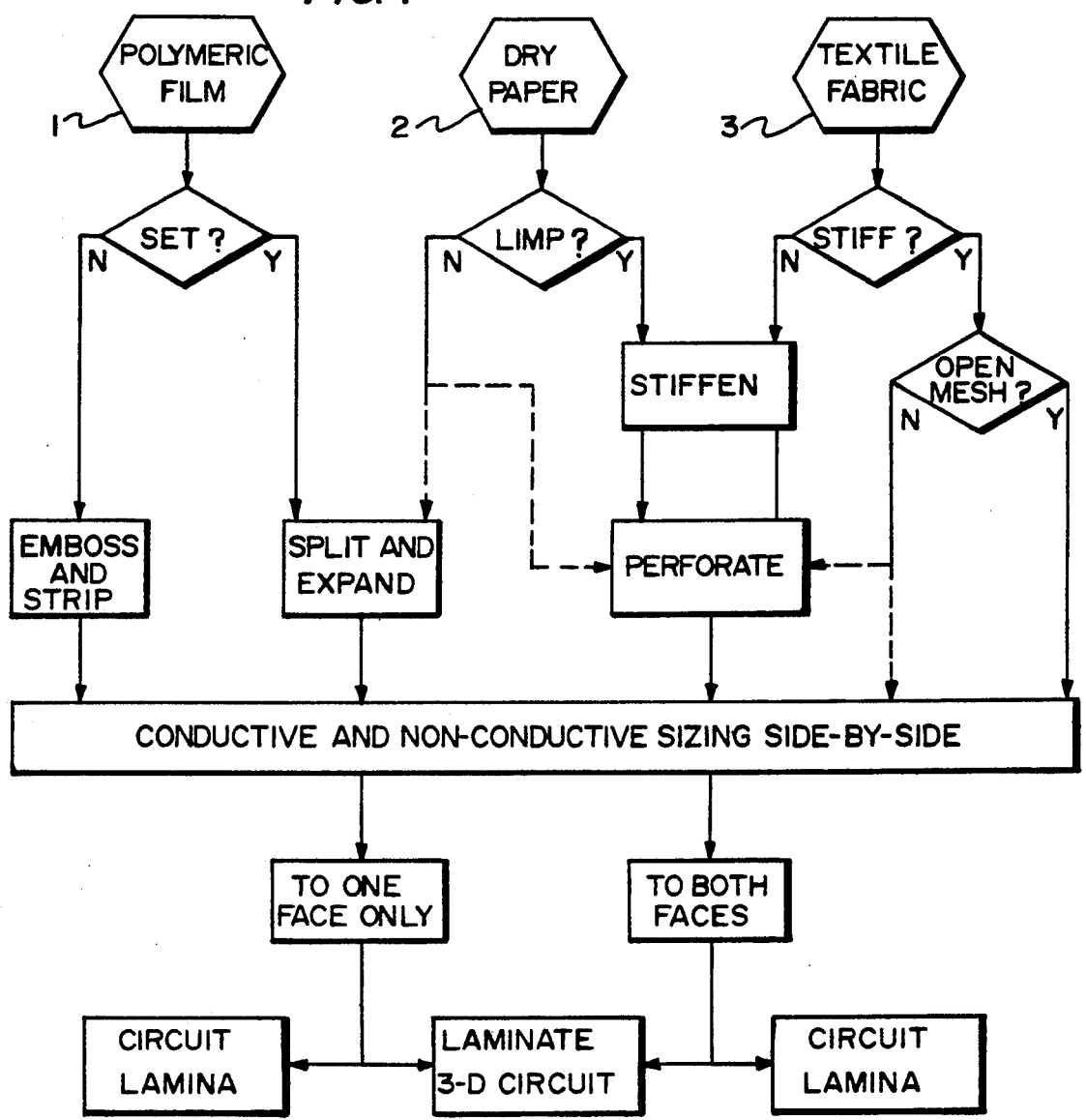
FIG. 1 is a schematic flow diagram of the method of this invention utilizing either polymeric film, dry paper, or textile fabric.

FIG. 1 shows diagrammatically how three selected pre-substrate materials (polymeric film 1, dry paper 2, or textile fabric 3) are processed into individual circuit laminae or into laminated three-dimensional (3-D) circuitry according to this invention. Below each of the materials is a row of queries, per material, to determine whether it is already stiff or wiry enough to be self-supporting. For the polymeric film the query is whether it is sufficiently "set" and if so it is slit and expanded (similarly to expanded metal lath) but if not it is embossed and the resulting thin portions stripped away to leave a gridlike structure—as shown in subsequent views. Dry paper if not limp is also slit and expanded, but if limp is stiffened and then perforated. Textile fabric if stiff may not need pretreatment, especially if open-mesh, but if not stiff is subjected to stiffening pretreatment, then if not open-mesh may be perforated or not before further treatment. The next level is substrate sizing with conductive and non-conductive compositions side-by-side, considered in detail in subsequent views—to produce circuit laminae sized on one face only or on both faces, useful in either form as circuit boards or combinable (either or both) face-to-face into laminated three-dimensional circuits, also shown subsequently.

Figure 2A:
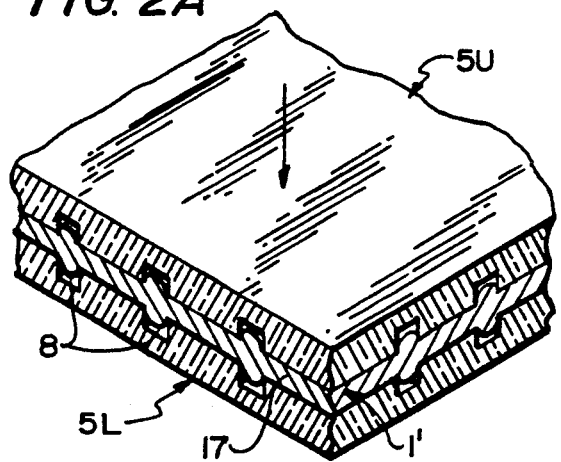
FIG. 2A is a schematic diagram of the embossing of incompletely set polymeric film in strip form during preparation of a substrate.
Figure 2B:
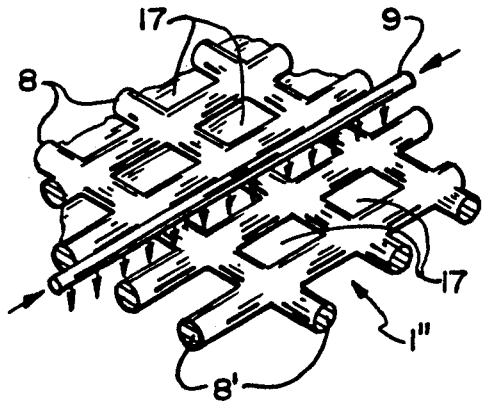
FIG. 2B is a schematic perspective view of the film of FIG. 2A in foraminous gridlike form undergoing removal of portions thinned by the embossing step to leave a foraminous gridlike structure.

FIGS. 2A and 2B show, as an example, embossing and stripping of an incompletely set polymeric film (the leftmost example in FIG. 1).

FIG. 2A shows, in transverse cross-section, die 5 similar in design to a waffle iron squeezing (vertical arrow) laminar strip 1' of polymeric film pre-substrate material between upper and lower die plates 5U and 5L as a step in its conversion to substrate material, producing orthogonally spaced ribs 8 interconnected by thin web 7.

FIG. 2B shows in perspective laminar strip 1" after removal from the die FIG. 2A and undergoing removal of the portions of web 7 between the gridlike structure of ribs 8. The strip is passing (arrow) under pipe 9 from which fluid (short vertical arrows) is blasting the web portions out from between the ribs, leaving (lower right) a gridlike structure with openings 7' where web 7 had been.

Figure 3A:
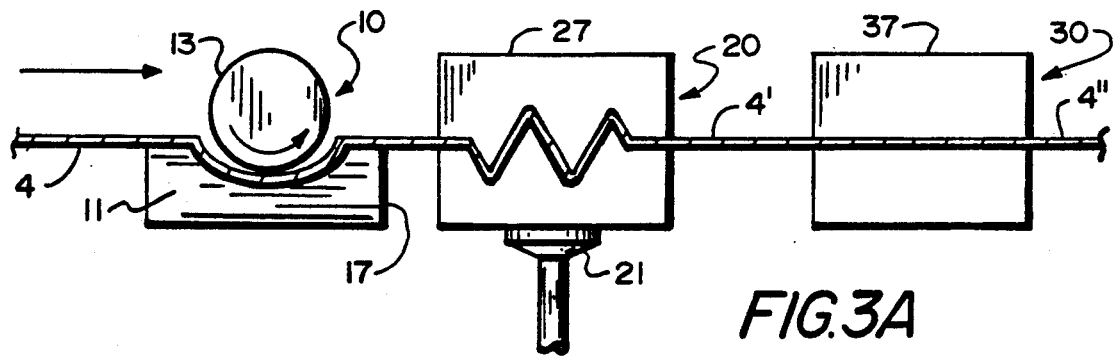
FIG. 3A is a schematic view of applying a stiffening agent, using a lick roll, to a laminar strip of pre-substrate material.

FIG. 3A shows, in schematic side view from left to right, first or coating stage 10 in application of curable coating agent 11 from open-top container 17 by overlying lick roll 13 to substrate material 4 in strip form while being forwarded (arrow) from left to right. This coating stage is followed by second or vibration stage 20 wherein coated substrate material (now designated 4') traverses enclosure 27 wherein it is vibrated (suggested by sawtooth outline) by transducer 21 to redistribute the coating agent thereon and/or to remove any excess. Then, coated substrate material (now designated 4') passes to and through third or pre-curing stage 30 in similar enclosure 37, within which it is exposed to radiation (e.g., infra red or ultra violet) from transducer 21. The radiation pre-cures the substrate material and/or the coating agent thereon to stiffen the coated material (then designated 4") before stages (shown later) wherein the substrate acquires patterned conductive structures.

Figure 3B:
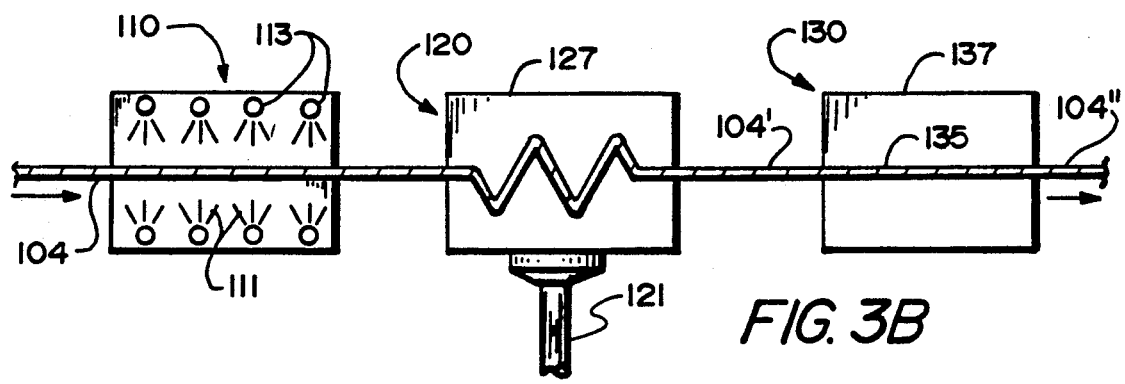
FIG. 3B is a schematic showing of application of a stiffening agent to like material, using misting, as an alternative to FIG. 3A.

FIG. 3B shows an alternative coating arrangement, wherein stage 10 of the preceding view is replaced by stage 110 in which misting chamber 117 replaces liquid container 17. (Reference numerals here are 100 larger than in the preceding view for analogous components.) Multiple nozzles 113 in the enclosure replace the former lick roll and are directed toward the substrate from both above and below, and across the width of the strip along a given length increment. Vibration stage 120 and pre-curing stage 130 follow, as stages 20 and 30 followed 10 in FIG. 3A, producing substrate 104' and then 104".

Figure 4:
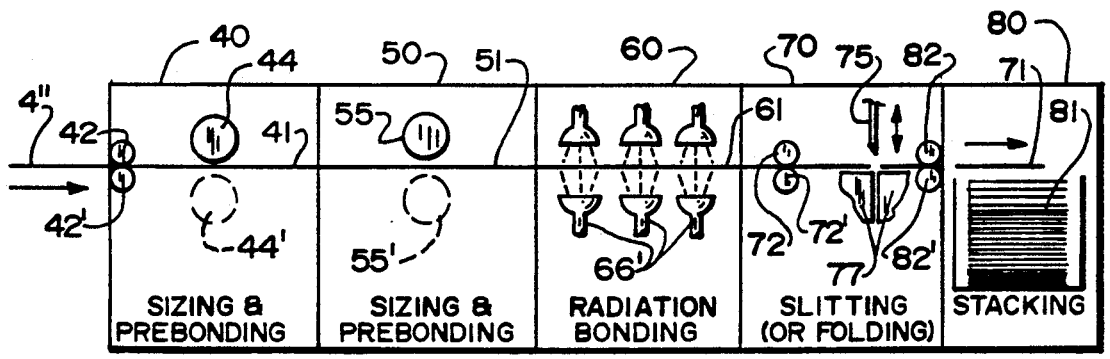
FIG. 4 is a schematic block diagram of processing a substrate strip resulting according to the preceding views into laminae useful for circuit boards or the like according to this invention.

FIG. 4 shows schematically, largely in left-to-right block diagram form, a foraminous substrate strip pre-treated according to the preceding views into laminae useful for circuit boards or the like according to this invention. Substrate strip 4" is forwarded by and between nip rolls 42, 42' (driven by means not shown) into stage 40 for sizing of conductive (or non-conductive) material by overlying roll 44 and preferably underlying roll 44' (alternatively a backup roll), and stage 50 for side-by-side sizing with unlike material by overlying roll 55 (and preferably underlying roll 55'). The sized strip is forwarded through stage 60 of radiation pre-bonding and by pairs of nip rolls 72, 72' and 82, 82' past intervening knife 75 in slitting stage 70. The strip is cut into a Succession of laminae and then deposited into stack 81 of such laminae in final stacking stage 80. Alternatively, as suggested parenthetically, stage 70 may be modified to fold such a strip, as in the next view.

Figure 5:
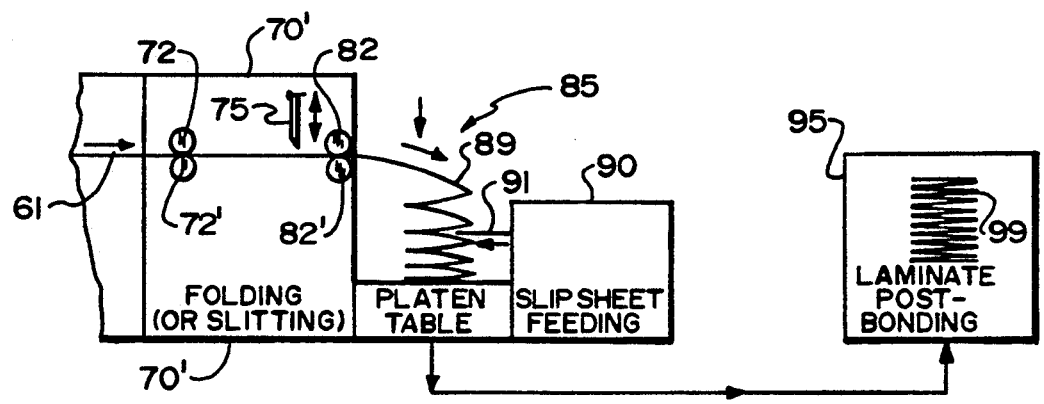
FIG. 5 is a schematic block diagram of processing an alternative substrate strip of FIG. 4 into a folding succession of laminae plus lamination thereof into a three-dimensional patterned laminate.

FIG. 5 shows schematically alternative concluding stages of the processing or treatment shown mainly in FIG. 4. In this alternative stage 70' knife 75—instead of cutting the processed strip 61 into a succession of individual laminae—cuts intermittently, whereupon longer cut lengths pass to folding stage 85 in which they are folded back and forth (accordion-pleated) to juxtapose successive laminae to one another. In stage 90, slip sheet feeder 91 inserts a slip sheet of non-adherent material between end laminae of successive cut lengths to prevent them from bonding together. In final stage 95, each folded length is subjected to a post-bonding, as under heat and pressure, so as to bond its juxtaposed laminae face-to-face into an individual laminated three-dimensional structure.

Figure 6A:
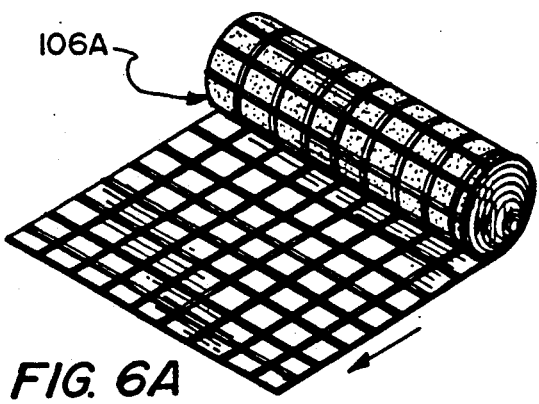
FIG. 6A is a perspective view of unrolling gridlike structure of substrate material such as produced according to FIGS. 2A and 2B.
Figure 6B:
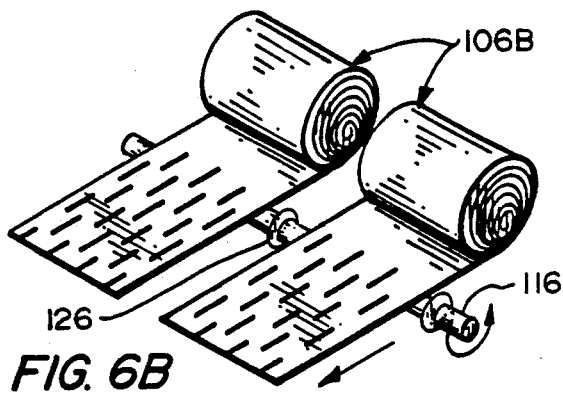
FIG. 6B is a perspective view of a side-by-side pair of unwinding rolls of continuous material being subjected to rotating knife slitting thereof for expansion into a substrate of this invention.

FIG. 6A show, in perspective, roll 106A unwinding (arrow) a strip of gridlike substrate material as was formed in FIGS. 2A, 2B;

FIG. 6B shows, also in perspective, side-by-side pair of unwinding rolls 106B of continuous material such as paper or plastic film. The unwound strips of material are subjected to discontinuous slitting, here by passing over underlying rotating bar 116 carrying a multiplicity of protruding teeth 126. The slit strips are suitable for subsequent processing according to this invention, after expansion laterally to produce a product similar to expanded metal lath.

Figure 6C:
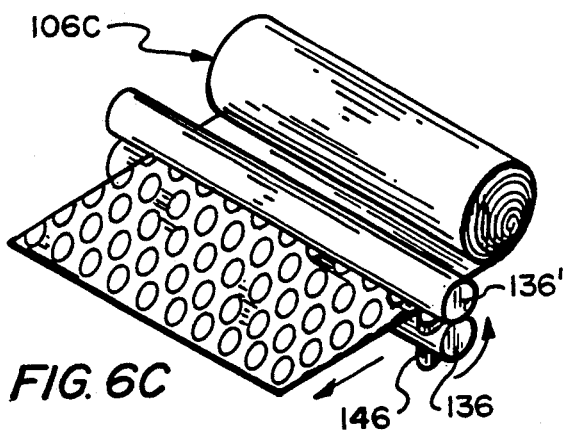
FIG. 6C is a similar view of an unwinding roll of continuous material being subjected to a rotary punch to remove generally circular portions therefrom in a substantially overall pattern.
Figure 6D:
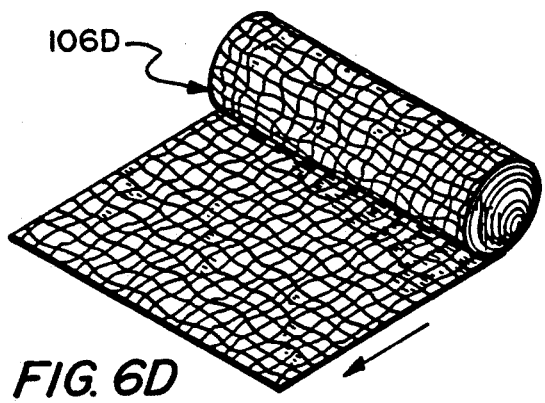
FIG. 6D is a perspective view of an unwinding roll of open-mesh textile material useful as a substrate according to this invention.

FIG. 6C shows similarly unwinding roll 107C of similarly continuous material being perforated, here by means of punching heads 146 on rotating bar 136, to remove circular portions therefrom;

FIG. 6D shows, also in perspective, unwinding roll 106D of open-mesh textile material similarly useful as a substrate according to this invention.

Figure 7A:
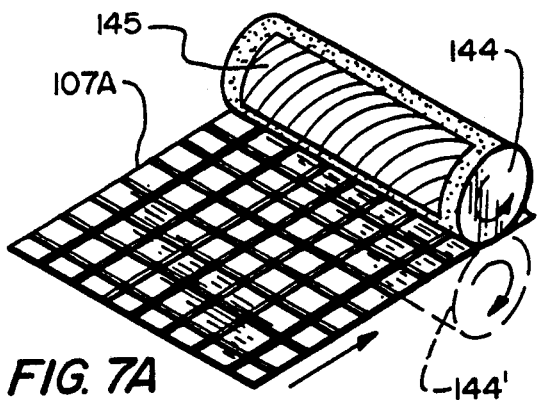
FIGS. 7A to 7D are schematic perspective views of respective foraminous substrate materials of 6A to 6D being forwarded into contact with rolls adapted to apply sizing composition thereto.
Figure 7B:
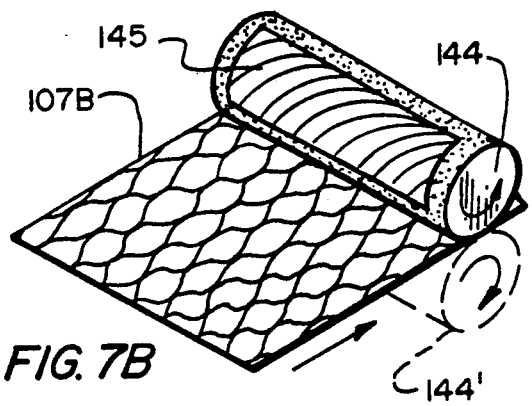
Figure 7C:
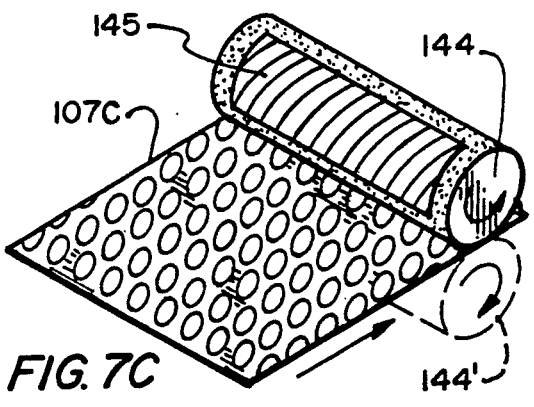
Figure 7D:
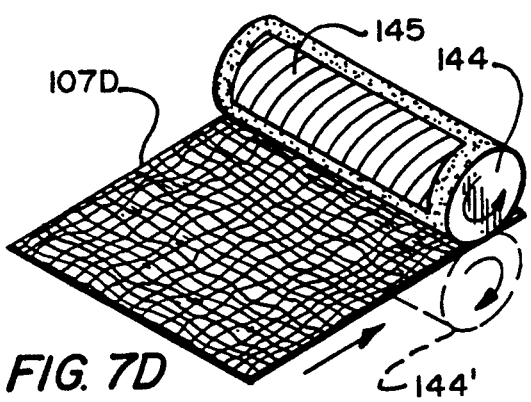

FIGS. 7A to 7D are schematic perspective views preparatory to application of sizing composition in patterned configuration to the respective materials of foraminous substrate strips 6A to 6D: viz., gridlike structure 107A of polymeric film or paper in FIG. 7A; expanded slit polymeric film or paper 107B in FIG. 7B; perforated paper or textile fabric 107C in FIG. 7C; and wiry open-mesh textile fabric 107D in FIG. 7D. In each of these views the strip material is being forwarded (arrow) toward the upper right. Overlying sizing roll 144 is shown in solid lines and has rectangular sized portion 145 about to contact the strip material, and optional underlying counter-rotating roll 145' shown in broken lines in each of FIGS. 7A to 7D backs up the material and may or may not also similarly apply sizing thereto.

FIGS. 8A to 8D are similarly corresponding representations of subsequent roll application of sizing composition to the respective unwound strip materials from the preceding set of views 7A to 7D. In each one, a strip of substrate material is being forwarded toward the lower left and has just passed in contact with and been sized by roll 144, and preferably roll 144'—optionally only a backup roll.

FIG. 9 shows, in vertically exploded perspective view, a series of laminae of side-by-side electrically conductive (unstippled) and non-conductive (stippled) portions, in like and unlike patterns, suited to being laminated into a three-dimensional circuit structure. From top to bottom appear (i) lamina A, having a wholly non-conductive pattern 100; (ii) lamina B, with outer non-conductive strips 100V flanking wide central conductive strip 101; (iii) lamina C, having a pair of parallel narrow conductive strips 102 spaced apart by wider central non-conductive strip 100W and flanked by pair of similarly wider non-conductive strips 100Y; (iv) lamina D, like lamina C except that the central non-conductive strip is replaced by narrow conductive strip 103 between pair of conductive strips 102.

Below lamina D in FIG. 9, are next (v) lamina C' like lamina C; then (vi) lamina B' like lamina B; and last (vii) lamina A' like lamina A. Hence, the stack of seven laminae is symmetrical upward and downward from central lamina D. It will be understood that they can be in individual cut sheet form, as here, but in practice they are preferably joined successively edge-to-edge in a folded strip. Wholly non-conductive laminae A and A' need not be made in the same way or even be composed of the same material as in the other laminae but they preferably are so made and composed for operating reasons.

FIG. 10 shows on a greatly enlarged scale a sectional elevation at X—X on FIG. 9 in substantial detail. Shown is conductive portion 101 (shaded for metal) at the left, and shown at the right is non-conductive portion 100V, the boundary between them being vertical. Shown extending horizontally midway between their horizontal top and bottom surfaces is a series of dashes 107X designating intervening discontinuous portions of FIG. 11 shows, in fragmentary perspective, resulting coaxial waveguide 199 with central conductor 103 surrounded by rectangular wall 105 visible at the near end thereof. This three-dimensional laminate comprises the component laminae (A, B, C, D, C', B', A') of FIG. 9 bonded together in face-to-face succession, usually aided by application of heat and pressure.

Processing of the component materials according to this invention is readily understood from the foregoing description and the accompanying diagrams, in the light of the first mentioned patent's specification. The following supplementary commentary also may aid in the selection and working of suitable materials and is offered as a guide to persons at least ordinarily skilled in circuit boards.

As already indicated, polymeric film, dry paper, and textile fabric all lend themselves to being (or being converted into) self-supporting foraminous substrates useful according to this invention. If not already both self-supporting and foraminous, the material is treated to become both, in either order, or if already one but not the other, the material is treated to supply the missing property. FIG. 1 shows many combinations of materials and orders of treatment.

As an example, a foraminous laminar strip sufficiently stiff to be self-supporting may be formed as in FIGS. 2A and 2B, or an insufficiently stiff strip may be so formed and be forwarded as a substrate precursor through at least one stage in which it is coated on at least one (preferably both) side(s) with a solidifiable liquid in substantially continuous or film form (as in FIG. 3A) or in discontinuous or droplet form (as in FIG. 3B)—which may or may not coalesce into continuous or film form.

In a subsequent stage the material so coated is exposed to an energy transducer to modify the coating, such as shaking off any excess, or subdividing a continuous coating into multiple droplets (or, conversely, coalescing droplets into a continuous layer), as in FIG. 3A, or in spray form as in FIG. 3B, controlling droplet formation and/or distribution and/or size, imbuing the substrate material therewith and deleting any excess thereof. Though straightforward mechanically applied vibration may suffice, vibration by sonic or even ultrasonic transmission is preferred as enabling finer control and greater range of results, as any operator can readily ascertain upon varying applied frequency, intensity, duration, or repetition.

For example, Elmer's glue in a continuous one-tenth millimeter layer on a paper tape strip like that used at supermarket check-out counters can be roughened or even broken into droplets of pinhead size about a mm apart by applying sonic energy thereto in the vicinity of twenty to thirty kiloHertz with the tape so exposed for several seconds during its passage past such a sonic transducer. Subsequent exposure to an air temperature of about 50° C. solidifies the glue in a similar exposure period, rendering the paper stiff enough to undergo application of patterned pastes or powders (which may be coalesced and hardened), cutting or punching, and even lamination with itself or other laminar material.

Textile fabrics or even bands of filaments may replace paper in the previous example. Their surface is inherently uneven and so susceptible to discontinuous coating by liquid applied thereto, as in droplets whose size is largely a function of filament size. Being less uniform than paper, such textile material is a poorer candidate for lamination but as good as (or better than) paper for stiffening.

Application of high sonic or low ultrasonic frequencies aids dispersion of coating liquid throughout woven, knitted, or felted textile materials. Textile materials may comprise incompletely polymerized fiber-forming polymers, which polymerize further or "cure" when subjected to a prescribed pre-curing stage. Pre-curing of them is only partial, and full curing or polymerization of partially cured material is brought about in later treatment as substrate material as specified subsequently in this description.

Polymerizable liquids may be applied to stable paper or textile substrate materials (in place of glue or the like) and then be polymerized partially by heating in the described pre-curing stage to stiffen the structure satisfactorily. Polymerizable compositions already partially polymerized to self-supporting stage and used as substrate material may co-polymerize with like material applied in liquid form or cross-link with existing polymers in paper or textile substrates. Resulting structures usually are progressively stiffer.

Non-fibrous laminar substrate materials, usually comprising organic or inorganic polymers, may be stiffened as well as lightened by other treatment including embossing with removal of the thinned portions (see FIGS. 2A and 2B). The substrate material, squeezed between opposing foraminous die plates, flows into the openings in the plates, from which it can be removed in any suitable manner, such as air-blasting—with or without sand or other abrasive—or by punching or vibrating the laminar material itself formed into a gridlike structure with preferably cylindrical runners (see FIG. 5).

Such gridlike structure may be stiff enough because of such embossing to dispense with additional pretreatment, or it may be pretreated further for stiffening, much as described above for paper or textile materials. It is noteworthy that any given liquid will form droplets of given size on given cylindrical structures not wetted thereby, in the manner of dew on a spider's web, without need for sonic energy or other means of vibration (though vibration may be useful in deleting superfluous substrate material, as noted).

After such pretreatment, the resulting substrate material must be sized with conductive and usually non-conductive compositions to provide desirably patterned electrically conductive structures.

Non-conductive gridlike configurations of substrate material may be filled in selectively with conductive pastes or the like, as to provide fiducial or registration checkpoints, or as through leads to tie both faces of the substrate together at given points, or even as terminals for circuit elements to be added. The present invention emphasizes coating gridlike and otherwise foraminous substrate materials characterized by a high degree of openness with not only conductive but also non-conductive compositions side-by-side to form a lamina in which the substrate occupies a nearly negligible volume, so it can be substantially disregarded in relation to the resulting electrically patterned structure and be considered as a homogeneous lamina in the thickness direction at almost any place on its faces. Thus, the resulting lamina thickness exceeds an interposed substrate fiber diameter or film thickness sufficiently that the electrical conductivity from a point on one face to the corresponding point on the opposite face of the lamina does not vary appreciably, though the relative conductivity varies drastically across the boundary between side-by-side conductive and non-conductive regions.

My aforementioned patent describes how conductive and non-conductive portions of identical thickness located side-by-side may form a single substrate-less lamina. The laminae of the present invention are only nearly substrate-less but offer similar advantages and benefits. Moreover, laminates may be formed by stacking laminae having such foraminous substrate structures, and adhering or cohering them suitably, as by further heating, optionally in vacuo.

Fiber-forming and film-forming polymeric materials supplement paper as suitable foraminous substrate materials; for example, vinyl polymers, such as polyvinyl chloride; polyhydrocarbons, such as polypropylene; polyamides, such as 6-nylon or 66-nylon; polyesters, such as polyethylene terephthalate; and polyurethanes. Normally the fibrous or film (or paper) materials will be procured in such form, rather than be produced from monomers or other precursor materials, except where a gridlike material is produced as described above.

Non-conductive sizing materials may comprise one or another of the same polymeric substrate compositions found in the substrate materials but are supplied in paste, powder, or liquid forms and are applied in paste, powder, droplet form rather than in solid form.

A non-conductive sizing material may comprise a thermoplastic organic polymer, such as an acrylic or vinyl resin or a polyester, or a thermosetting polymer, such as an epoxy resin or a phenolformaldehyde or melamine-formaldehyde resin. Solvent or plasticizer for such polymer may be present in the sizing material, with or without inert diluent, and be evaporated therefrom by prebonding exposure to ambient air (usually with heating) after having been sized onto the substrate. Alcohols, aldehydes, esters, ethers, ketones, and mixtures thereof may serve such purpose. Examples include butyl acetate, butyl carbitol, and methyl ethyl ketone.

An electrically conductive sizing material may closely resemble the non-conductive paste compositions just mentioned, but with added conductive particulate material, such as metallic powder or flakes, or even non-metallic material such as graphite. Suitable metallics include aluminum, copper, gold, indium, lead, silver, tin, and the platinum group metals. Upon evaporation of solvent therefrom, the conductive particulates are retained in intimate mutual contact by a reticulated matrix or network of micromolecular polymeric strands.

Such paste compositions, though they are specialty chemicals, are articles of commerce and readily available, as from Minico/Asahi Chemical of America, in Congers, N.Y., for example. They are suitable for screening through about 100 to 300 mesh, as are mixes of them.

Suitable curing temperatures depend upon the resins used, but a range suited to many of the compositions is from about ten to thirty minutes at from about 100° to 200° C., usually in the mid-range of both time and temperature. Substitution of more intense infra-red radiation sources is often effective to reduce the time to less than half, even to a fifth or even a tenth, of the first stated range.

Pastes are applied most readily from rotating rolls; powders are applied from rolls or by jetting; and droplets are applied by jetting. Printing technologies are most nearly analogous and are well developed, including forwarding and sizing techniques.

Preferred embodiments and variants of this invention have been suggested. Other modifications may be made, as by adding, combining, deleting, or subdividing compositions, parts, or steps, while retaining at least some of the advantages and benefits of the present invention—which itself is defined in the following claims.

I claim:

1. A method of providing patterned electrical laminar structures, comprising the steps of
   providing a stiff strip of paper, textile, or polymeric film;
   rendering the strip foraminous, by making a multiplicity of face-to-face openings therein substantially overall; and
   sizing at least one face of the strip with bondable configured electrically conductive sizing material and bondable electrically non-conductive materials in side-by-side patterned configuration; and then
   bonding the respective sizing materials in place and together on the sized strip.

2. Method according to claim 1, including so sizing both faces of the strip alike, thereby sandwiching the foraminous strip material, and bonding the sized strip by exposing it to a bonding temperature.

3. Method according to claim 1, wherein the strip material comprises dry paper or set polymeric film, including the presizing step of rendering the strip foraminous by perforating it with a multiplicity of openings.

4. Method according to claim 1, wherein the strip comprises dry paper or set polymeric film, including the pre-sizing steps of making a multiplicity of like discontinuous longitudinal slits aligned lengthwise thereof evenly spaced in a plurality of evenly spaced lines, the slits in alternate lines being aligned laterally, and the slits in adjacent lines being offset laterally, and then expanding the strip laterally to expand the slits into openings and thereby rendering the strip foraminous.

5. Method according to claim 1, wherein the strip comprises a polymeric film or an open-mesh fabric, wherein the strip is stiffened to self-supporting condition by the pre-sizing steps of coating it with liquid adhesive and vibrating the strip to distribute the liquid adhesive thereon.

6. Method of forming a self-supporting laminar structure with patterned electrical circuitry portions on a foraminous substrate, comprising the steps of
   sizing a foraminous strip on at least one face with both
   a bondable electrically conductive sizing material in the configuration of at least one circuit element pattern, and
   a bondable electrically non-conductive sizing material in lateral contiguity with the configured conductive sizing material; wherein the sizing materials comprise a configurable composition adapted to be consolidated into self-supporting condition upon bonding exposure, including heating above ambient temperature; and
   bonding the respective sizing materials in place and together after thereon sizing the steps, thus consolidating into a single lamina adapted to be self-supporting.

7. Method according to claim 6, including sizing the strip alike on both sides, thereby producing a lamina having side-by-side conductive and non-conductive portions extending from face to face of the lamina, substantially homogeneous conductively in the thickness direction despite presence of the foraminous substrate.

8. Method according to claim 7, including the step of sizing successive length segments of the strip alike with a given patterned electrical circuitry configuration, and then severing the strip into a succession of like laminae so patterned.

9. Method according to claim 7, including the step of sizing successive length segments of the strip with a succession of given patterned electrical circuitry configurations, and then severing the strip into a succession of unlike laminae so patterned.

10. Method according to claim 6, wherein the electrically conductive sizing material comprises metallic particulates and organic materials adapted to form a polymeric matrix about such particulates to maintain them in mutual conductive contact.

11. Method according to claim 10, wherein the particulates include at least one of aluminum, copper, gold, graphite, indium, lead, silver, tin, and the platinum group metals.

12. Method according to claim 7, including folding the lamina transversely along its length segment junctions, and thereby juxtaposing face-to-face adjacent length segments, and bonding the juxtaposed length segments face-to-face, thus laminating them into a patterned electrically conductive three-dimensional structure.

13. Coaxial waveguide made according to the method of claim 12.

14. A method of providing patterned electrical laminar structures, comprising the steps of
   providing a limp strip of paper, textile, or polymeric film,
   rendering the strip foraminous by making a multiplicity of face-to-face openings therein substantially overall;
   stiffening the strip to be self-supporting, by applying thereto a liquid adapted to stiffen upon drying;
   sizing at least one face of the strip with bondable configured electrically conductive sizing material and bondable electrically non-conductive materials in side-by-side patterned configuration; and then
   bonding the respective sizing materials in place and together on the sized strip.

15. Method according to claim 14, including so sizing both faces of the strip alike, thereby sandwiching the foraminous strip material, and bonding the sized strip by exposing it to a bonding temperature.

16. Method according to claim 14, including the pre-sizing step of vibrating the foraminous strip material to distribute the adhesive material thereon.

17. Method of making a coaxial waveguide, comprising steps of
   sizing length segments of a foraminous strip on at least one face with both a bondable electrically conductive sizing material and a bondable electrically non-conductive sizing material side-by-side, in laminar electrically patterned configurations, as follows: waveguide top and bottom wall segments as like patterns (B, B'), waveguide upper and lower sidewall segments without center conductor as like patterns (C, C'), and right and left sidewall portions with center conductor portion as an intermediate pattern (D);

juxtaposing the laminar segments face-to-face from top-to-bottom as follows: to wall segment (B), upper sidewall segment (C), intermediate segment (D), lower sidewall segment (C'), and bottom segment (B'); and bonding the juxtaposed segments together face-to-face.

18. Coaxial waveguide made by the method of claim 17.

19. Method according to claim 17, including a step of sandwiching the top and bottom segments of the coaxial waveguide between overlying and underlying non-conductive segments (A, A'), in the following face-to-face top-to-bottom pre-bonding order: overlying non-conductive segment (A), top wall segment (B), upper sidewall segment (C), intermediate segment (D), lower sidewall segment (C'), bottom segment (B'), and underlying non-conductive segment (A');

and bonding all face-to-face segments together by heating.

20. Coaxial waveguide made by the method of claim 19.

* * * * *